(12) United States Patent
Baumgartner

(10) Patent No.: US 6,906,306 B2
(45) Date of Patent: Jun. 14, 2005

(54) PHOTODIODE OPTICAL POWER MONITOR

(75) Inventor: Steven J. Baumgartner, Zumbro Falls, MN (US)

(73) Assignee: JDS Uniphase Corporation, San Jose, CA (US)

( * ) Notice: Subject to any disclaimer, the term of this patent is extended or adjusted under 35 U.S.C. 154(b) by 214 days.

(21) Appl. No.: 10/388,682

(22) Filed: Mar. 14, 2003

(65) Prior Publication Data

US 2003/0201381 A1 Oct. 30, 2003

Related U.S. Application Data

(60) Provisional application No. 60/376,899, filed on Apr. 30, 2002.

(51) Int. Cl.[7] ............................................. H01J 40/14
(52) U.S. Cl. ................................................. 250/214 A
(58) Field of Search .......................... 250/214 R, 214 A, 250/214 AL, 214 LA; 398/209, 207

(56) References Cited

U.S. PATENT DOCUMENTS 6,528,777 B2 * 3/2003 Ames ..................... 250/214 R

* cited by examiner

*Primary Examiner*—David Porta
*Assistant Examiner*—Tony Ko
(74) *Attorney, Agent, or Firm*—Allen, Dyer, Doppelt, Milbrath & Gilchrist, P.A.

(57) ABSTRACT

The invention relates to an optical power monitoring device for a photodiode assembly, which converts the DC component of a photodiode's bias current into a common mode voltage indicative of the average optical power of the incident light. The photodiode assembly, which is mountable in a conventional four-lead TO can package, includes a photodiode, a pre-amplifier, and a common mode voltage controller. The common mode voltage is added to the differential voltage, and the combined signal is output via the two data signal leads of the TO can package.

13 Claims, 4 Drawing Sheets

PHOTODIODE OPTICAL POWER MONITOR

CROSS-REFERENCE TO RELATED APPLICATIONS

The present invention claims priority from U.S. patent application Ser. No. 60/376,899 filed Apr. 30, 2002.

TECHNICAL FIELD

The present invention relates to an optical power monitor for use with a photodiode, and in particular to the conversion of the DC component of the photodiode bias current into a common mode voltage signal for transmitting the average optical power of incoming light via the differential outputs.

BACKGROUND OF THE INVENTION

Standard photodiodes are packaged along with a pre-amplifier in a transistor-outline (TO) can package. A TO can package is a hermetically sealed unit with a lens in one end for directing incoming light onto the photodiode, which converts the light into an electrical current. The conventional TO can package implementation of an optical receiver includes four leads, two of which provide transmission of power (Power and Ground) and two of which provide transmission of differential data (Out+ and Out−). Newly developed electro-optic devices, e.g. transceivers, offer diagnostic capabilities, such as optical power monitoring, which includes measuring the power level of the input optical signal. Monitoring the power level of incoming light provides an indication of the quality of the transmitting laser, as well as the incoming transmission line. Conventional optical power monitors are relatively complicated and costly. Moreover, the aforementioned basic requirements consume all of the four leads from the conventional TO can, leaving none for transmitting the optical power level or any other operating parameter. One option is to add additional leads; however, this option increases costs and makes assembly more difficult, particularly for small form factor (SFF) devices. Another option is to utilize the AC component of the photodiode current, such as disclosed in U.S. Pat. No. 6,528,777 issued Mar. 4, 2003 to Ames et al. Unfortunately, this system does not incorporate any feedback in the control system and can therefore develop large errors due to drift over the environmental corners.

An object of the present invention is to overcome the shortcomings of the prior art by providing a relatively simple and inexpensive optical power monitor for a photodiode in a conventional four-lead TO can package.

Another object of the present invention is to provide a means by which the photodiode bias current level is monitored using a common mode signal that can be transmitted using the existing four leads provided by a conventional TO can package.

SUMMARY OF THE INVENTION

Accordingly, the present invention relates to a photodiode assembly mountable in a transistor outline can package, of the type including four leads extending therefrom, comprising:

a photodiode for converting incident light into a photodiode current comprising an alternating (AC) component indicative of an amplitude of the optical power of the incident light, and a direct current (DC) component indicative of an average optical power of the incident light;

a pre-amplifier for converting the AC component into a differential signal defined by a difference between a first alternating output signal and a second alternating output signal, complementary to the first alternating output signal; and a common-mode controller for controlling a common mode signal between the first and second alternating output signals based on the DC component;

wherein the common mode signal and the differential output signal are combined for transmission via two of the four leads, whereby the common mode signal can be extracted from the differential output signal to provide an indication of the optical power of the incident light.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
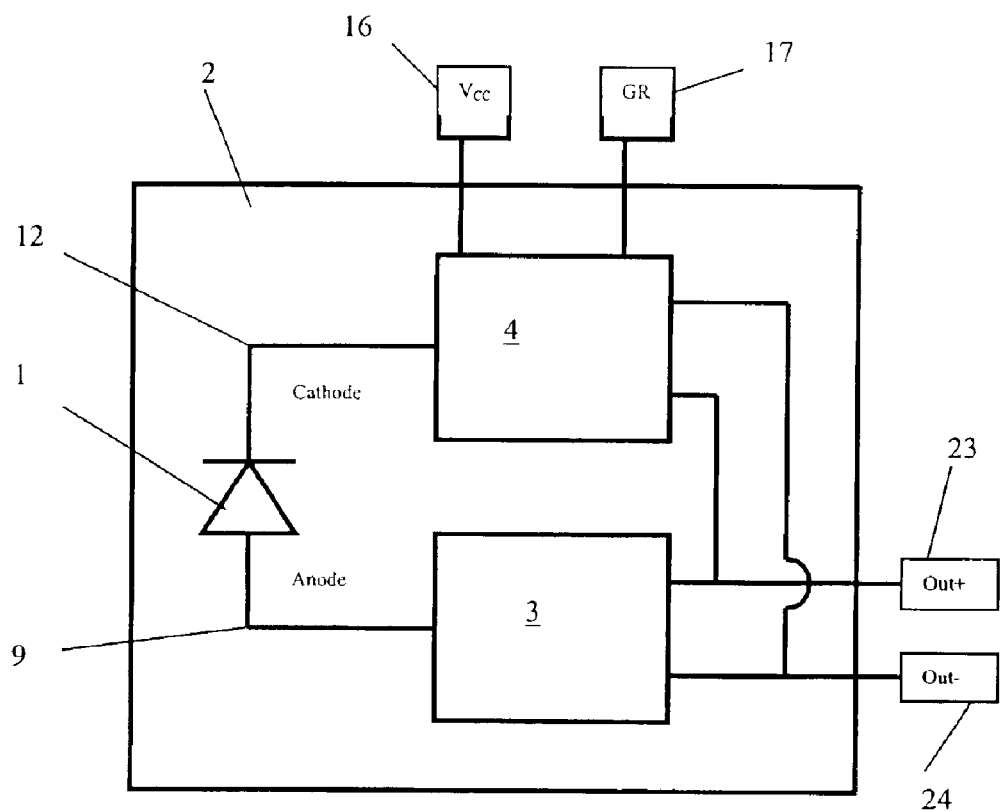
FIG. 1 is a schematic representation of the photodiode assembly according to the present invention.
Figure 2:
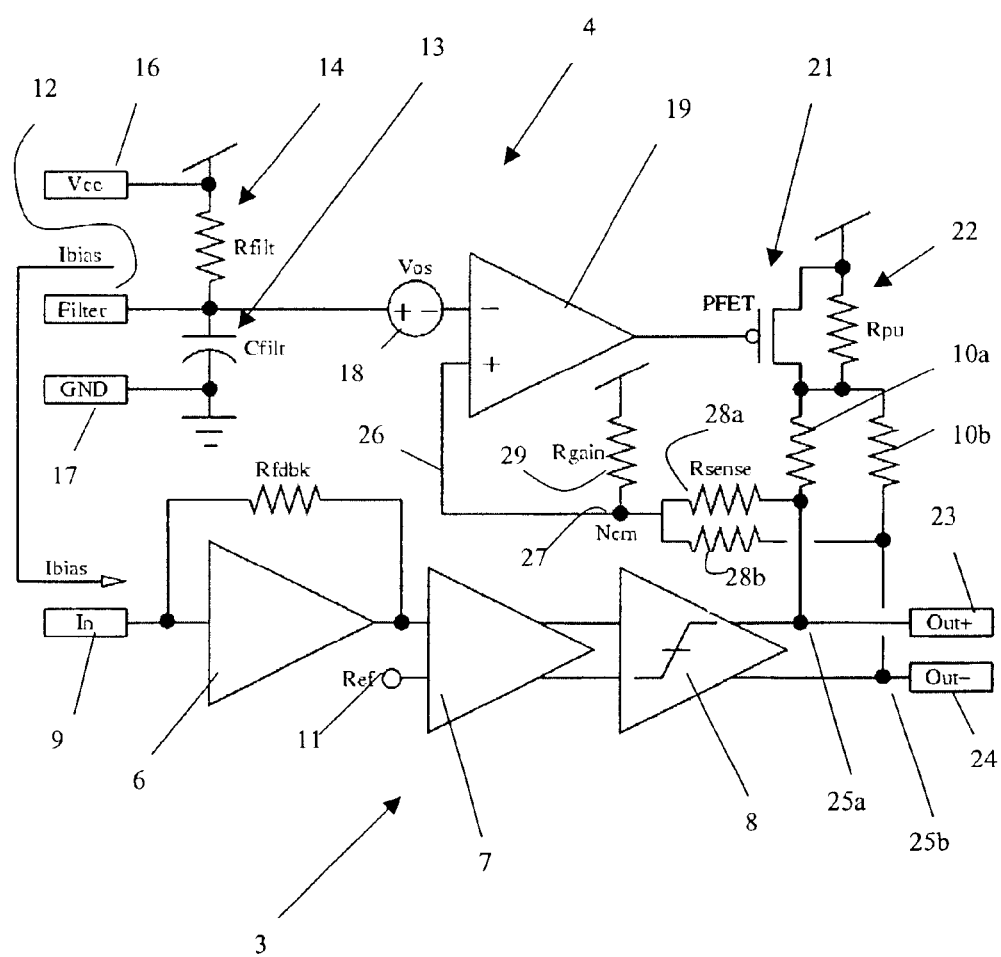
FIG. 2 is a more detailed circuit diagram of the photodiode assembly of FIG. 1.

With reference to FIGS. 1 and 2, the circuitry accompanying a photodiode 1 in a TO can package 2 includes a pre-amplifier 3 and a common mode signal controller 4. The illustrated photodiode 1 is a reverse biased photodiode, which responds to an incident optical signal by generating an initial current with both an AC and a DC component. The pre-amplifier 3 is a high speed trans-impedance amplifier comprised of first, second and third stages 6, 7 and 8, respectively, which translates the AC component of the initial current into a differential output signal, e.g. $V_{diff} = V_{out+} - V_{out-}$. The differential signal amplitude is thereby proportional to the incident optical signal amplitude. The common mode signal controller 4 is a current to voltage converter using a low frequency signal path for developing a common mode output signal, e.g. $V_{cm} = (V_{out+} + V_{out-})/2$, proportional to the photodiode bias current, i.e. the average optical power of the incident optical signal. Preferably, the differential signal is a differential voltage signal, and the common mode signal is a common mode voltage signal, although a person skilled in the art could conceive of other forms of signals, e.g. current.

Figure 3:
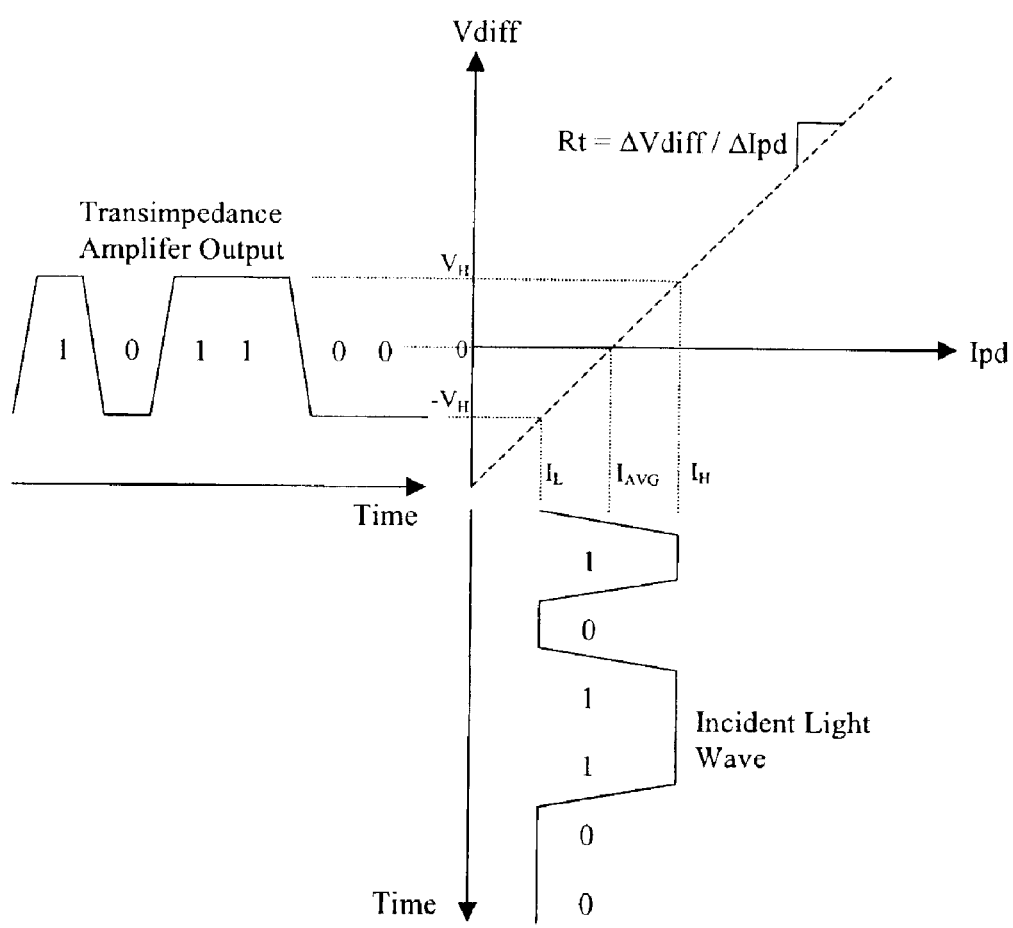
FIG. 3 is a graphical representation of the AC response of the transimpedance amplifier of the photodiode assembly of FIG. 1.

The anode of the photodiode 1 sources the current to the In connection 9 of the transimpedance amplifier 3, which eliminates the DC component by any one of a number of known methods, and which provides a differential voltage signal defined by a difference between a first alternating output voltage signal and a second alternating output voltage signal, complementary to the first alternating output voltage signal. The output of the second stage 7 of the trans-impedance amplifier 3 ideally is a differential waveform in which the average values of each single ended waveform are equal. To accomplish this, a Ref signal is introduced at 11, which is equal to the average of the output of the first stage 6. Alternatively, the DC component can be eliminated before the first stage 6 via an inductor (not shown) electrically connected from the In connection 9 to ground, or with some other equivalent active circuit, and by making Ref equivalent to ground. Other techniques for canceling the DC offset component are well known to those skilled in the art. Even if some DC offset exists, the common mode voltage is not affected, since it is controlled by an independent circuit. The third stage 8 converts first and second alternating current signals to the first and second alternating voltage signals using first and second load resistors 10a and 10b. The AC response of the trans-impedance amplifier 3 is illustrated in FIG. 3. The average $V_{diff}$ output is equal to 0 when the DC component has been completely eliminated. $R_t$, the trans-impedance gain, is equal to $\Delta V_{diff}/\Delta I_{pd}$.

Figure 4:
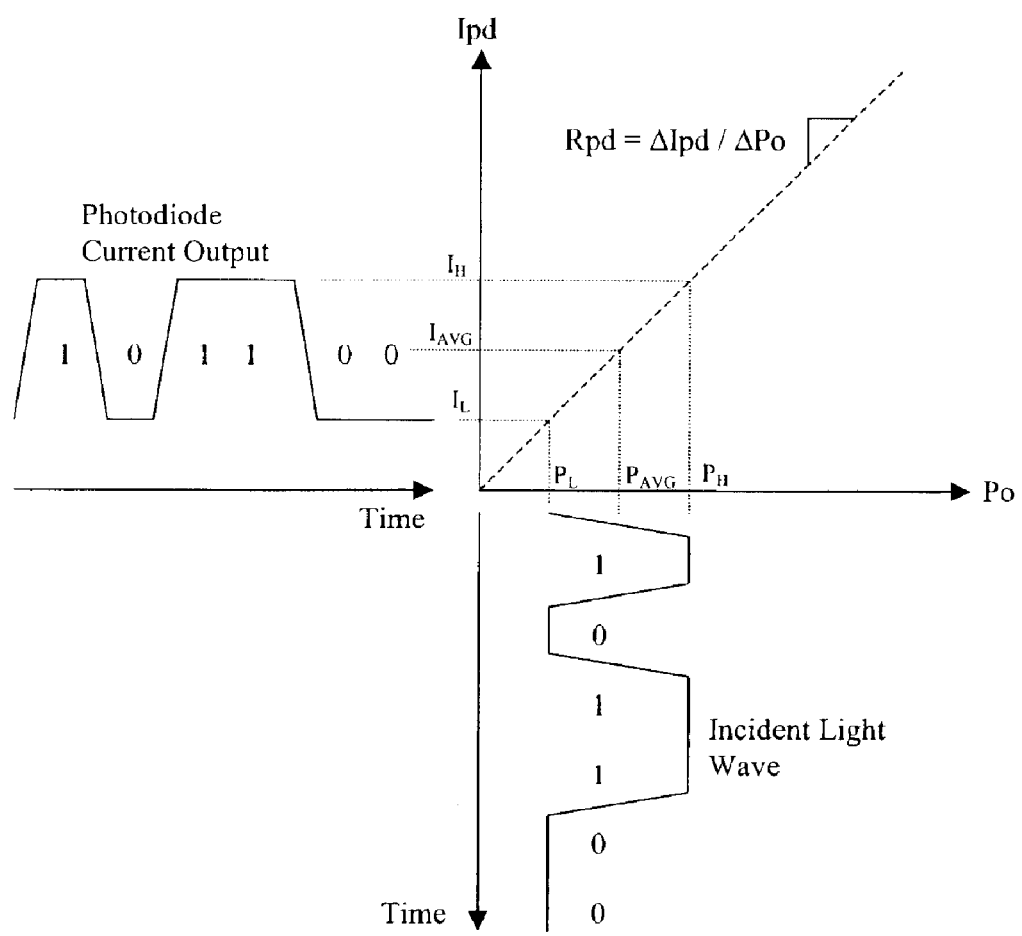
FIG. 4 is a graphical representation of the transfer function of the photodiode of the photodiode assembly of FIG. 1.

The cathode of the photodiode 1 sinks the current ($I_{bias}$) from the Filter connection 12 to the common mode voltage controller 4. In this case the high speed AC data component is filtered off by a low-pass filter comprised of a filter capacitor 13 ($C_{filt}$) and a filter resistor 14 ($R_{filt}$), leaving only the average current ($I_{AVG}$) to determine the voltage at the Filter connection 12. The voltage at the Filter connection 12 can be calculated by subtracting the voltage drop through the filter resistor 14 ($R_{filt}$) from the supply voltage ($V_{cc}$) provided via first and second leads 16 and 17, i.e. $V_{filt} = V_{cc} - I_{AVG} R_{filt}$. Accordingly, with reference to FIG. 4, the voltage $V_{filt}$ is related to the average optical power by the photodiode responsivity, $R_{pd}$. Subsequently, the voltage $V_{filt}$ is level shifted by a voltage offset 18, and input to a negative terminal of an OPAMP 19. The voltage offset 18 is large enough to enable the output drivers bias current to develop output voltage swing large enough to signal the data. The output of the OPAMP 19 is a control voltage fed to the gate of a PFET 21. The OPAMP 19 thereby controls the PFET 21, which acts like a variable resistor, by shunting a pull up resistor 22 ($R_{pu}$), and causing the voltage on the drain of the PFET 21 to vary. The variation of the voltage on the drain of PFET 21 causes the common mode voltage of the outputs (Out+ and Out−) 23 and 24 to vary.

If the Ref level into the second stage 7 is equal to the average of the output of the first stage 6, then the $V_{diff}$ would be positive for a digital "1" and negative for a digital "0". This alternating output is summed with the common mode signal at output nodes 25a and 25b. After exiting the TO can 2, the common mode signal is extracted by external circuitry, which can then determine the average optical power of the incoming optical signal.

A feedback loop 26 is provided to compensate for inconsistencies in the PFET 21 caused by manufacturing tolerances, which alter the characteristic voltages, e.g. threshold voltage, and by voltage and temperature variations. The common mode voltage ($V_{cm}$) is sensed by a center tap 27 of two sense resistors 28a and 28b ($R_{sense}$), which feedback a feedback voltage to the positive terminal of the OPAMP 19. An additional gain resistor 29 ($R_{gain}$) can be provided to adjust the closed loop gain of the circuit, thereby maximizing the resolution of the common mode voltage signal. The output of the OPAMP 19, i.e. the control voltage, converges to whatever voltage is required on the gate of the PFET 21 so that the loop reaches a balanced state, which occurs when the positive and negative input terminals to the OPAMP 19 are equal.

Accordingly, it is possible to determine the level of $I_{bias}$ by recovering the common mode voltage $V_{cm}$ of the outputs 23 and 24 utilizing the following equation:

$$V_{cm} = V_{cc} - (I_{bias} R_{filt} + V_{os})(R_{sense}/2 + R_{gain})/R_{gain}$$

Assuming K and L are constants depending on the values of $V_{os}$, $R_{sense}$, $R_{filt}$, and $R_{gain}$ we can rewrite the equation as:

$$I_{bias} \times K + L = V_{cc} - V_{cm}$$

I claim:

1. A photodiode assembly mountable in a transistor outline can package, of the type including four leads extending therefrom, comprising:
   a photodiode for converting incident light into a photodiode current comprising an AC component indicative of an amplitude of the optical power of the incident light, and a DC component indicative of an average optical power of the incident light;
   a pre-amplifier for converting the AC component into a differential signal defined by a difference between a first alternating output signal and a second alternating output signal, complementary to the first alternating output signal; and
   a common-mode controller for controlling a common mode signal between the first and second alternating output signals based on the DC component;
   wherein the common mode signal and the differential output signal are combined for transmission via two of the four leads, whereby the common mode signal can be extracted from the differential output signal to provide an indication of the optical power of the incident light.

2. The assembly according to claim 1, wherein the pre-amplifier is a trans-impedance amplifier.

3. The assembly according to claim 1, wherein the differential signal is comprised of a differential voltage signal; and wherein the common-mode signal is comprised of a common mode voltage signal.

4. The assembly according to claim 3, wherein the common-mode controller comprises:
   a current to voltage converter for converting the DC component into a proportional control voltage; and
   a variable resistor controlled by the control voltage for adjusting the common mode voltage signal.

5. The assembly according to claim 4, wherein the current to voltage converter comprises a filter resistance for establishing a filter voltage, and an amplifier for receiving the filter voltage, and for setting the control voltage.

6. The assembly according to claim 5, wherein the variable resistor comprises a transistor providing a resistance based on the control voltage.

7. The assembly according to claim 6, wherein the variable resistor further comprises a fixed resistance in parallel with the transistor.

8. The assembly according to claim 5, wherein two of the leads provide an input power voltage to the photodiode; and wherein the filter voltage is proportional to the input power voltage minus the product of the DC component and the filter resistance.

9. The assembly according to claim 6, wherein the transistor includes a gate and a drain; wherein the amplifier comprises an operational amplifier for receiving the filter voltage, and for setting the control voltage to control the gate of the transistor, thereby varying the common mode voltage signal.

10. The assembly according to claim 9, wherein the common mode voltage controller includes a feedback loop for adjusting the control voltage to compensate for variations in the transistor based on manufacturing tolerances and/or voltage and temperature changes.

11. The assembly according to claim 10, wherein the filter voltage is fed to a first terminal of the operational amplifier; wherein the feed back loop includes a sense resistance providing a feedback voltage, which is fed to a second terminal of the operational amplifier, whereby the operational amplifier adjusts the control voltage to whatever voltage is required to make the feedback voltage equivalent to the filter voltage.

12. The assembly according to claim 5, wherein the common mode voltage controller includes a low pass filter for filtering off the AC component of the photodiode current.

13. The assembly according to claim 12, wherein the low pass filter includes the filter resistance and a filter capacitance forming an RC circuit.

* * * * *